United States Patent
Kinoshita et al.

(10) Patent No.: US 6,859,070 B2
(45) Date of Patent: Feb. 22, 2005

(54) SEMICONDUCTOR INTEGRATED CIRCUIT DEVICE HAVING FLIP-FLOPS THAT CAN BE RESET EASILY

(75) Inventors: Koichi Kinoshita, Yokohama (JP); Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/389,876

(22) Filed: Mar. 18, 2003

(65) Prior Publication Data

US 2004/0145937 A1 Jul. 29, 2004

(30) Foreign Application Priority Data

Jan. 23, 2003 (JP) ........................ 2003-014389

(51) Int. Cl.[7] .................... H03K 19/00; G01R 31/28
(52) U.S. Cl. ...................... 326/93; 326/96; 714/726
(58) Field of Search .................. 326/93, 96; 327/203, 327/210, 211, 152; 714/726, 731, 729, 724

(56) References Cited

U.S. PATENT DOCUMENTS

| | | | | |
|---|---|---|---|---|
| 5,015,875 A | * | 5/1991 | Giles et al. | 327/203 |
| 5,617,428 A | * | 4/1997 | Andoh | 714/726 |
| 5,689,517 A | * | 11/1997 | Ruparel | 714/731 |
| 5,881,067 A | * | 3/1999 | Narayanan et al. | 714/726 |
| 5,898,330 A | * | 4/1999 | Klass | 327/210 |
| 6,023,179 A | * | 2/2000 | Klass | 327/211 |

FOREIGN PATENT DOCUMENTS

JP 2000-187993 7/2000

OTHER PUBLICATIONS

Samuel D. Naffziger, et al. "The Implementation of the Next–Generation 64B Itanium Microprocessor," 2002 IEEE International Solid–State Circuits Conference, 2002, pp. 344–345.

* cited by examiner

*Primary Examiner*—Patrick Wamsley
(74) *Attorney, Agent, or Firm*—Oblon, Spivak, McClelland, Maier & Neustadt, P.C.

(57) ABSTRACT

A semiconductor integrated circuit device includes a plurality of flip-flops, each of which has an external input terminal and external output terminal, the flip-flops being cascade-connected by having data output terminals respectively connected to data input terminals of the next-stage flip-flops. A reset signal is input via the external input terminal of the first-stage flip-flop and is sequentially transferred from the external output terminal thereof to the next-stage flip-flops. The reset signal is transferred via a transmission path different from the original data transmission path to reset all of the flip-flops.

8 Claims, 5 Drawing Sheets

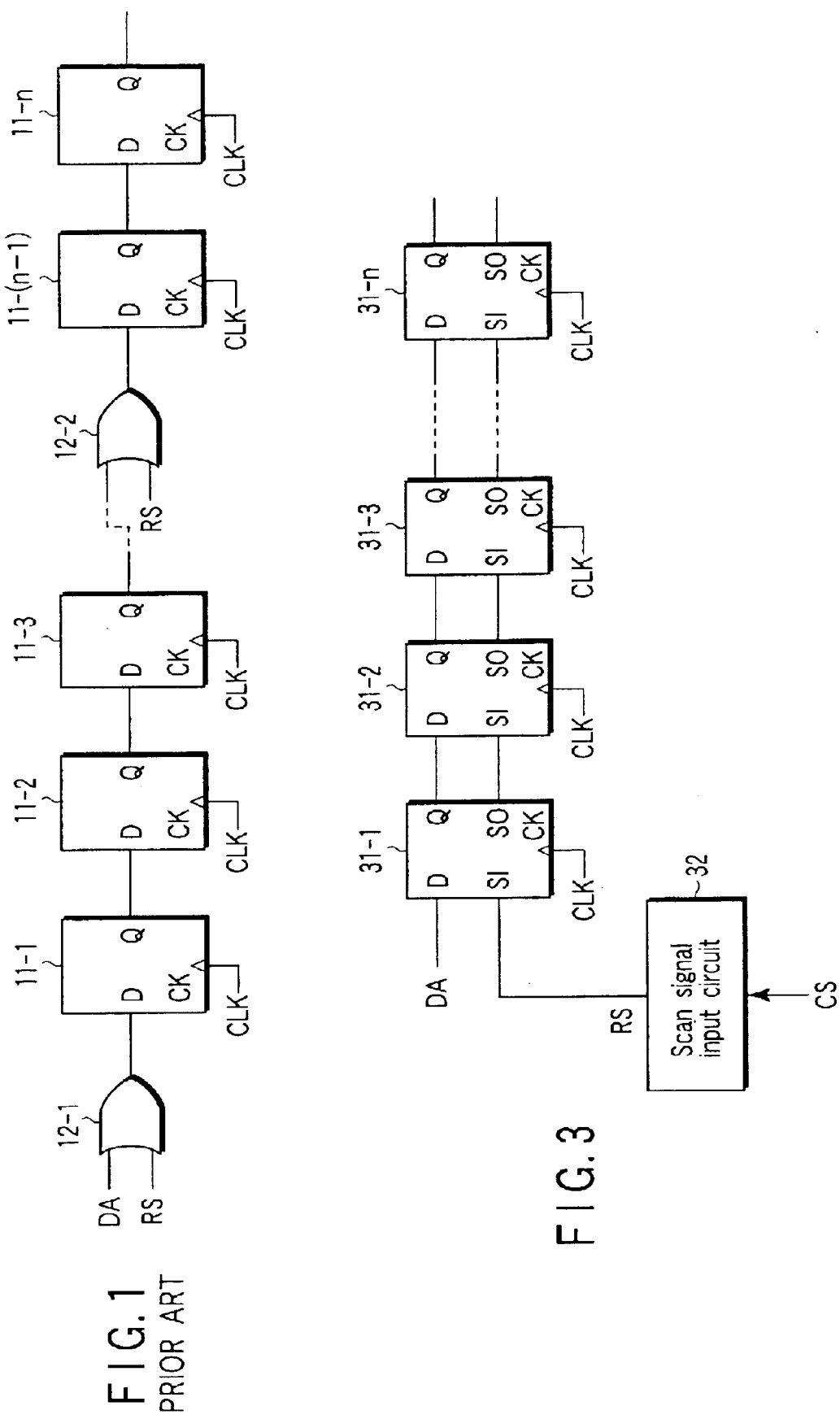

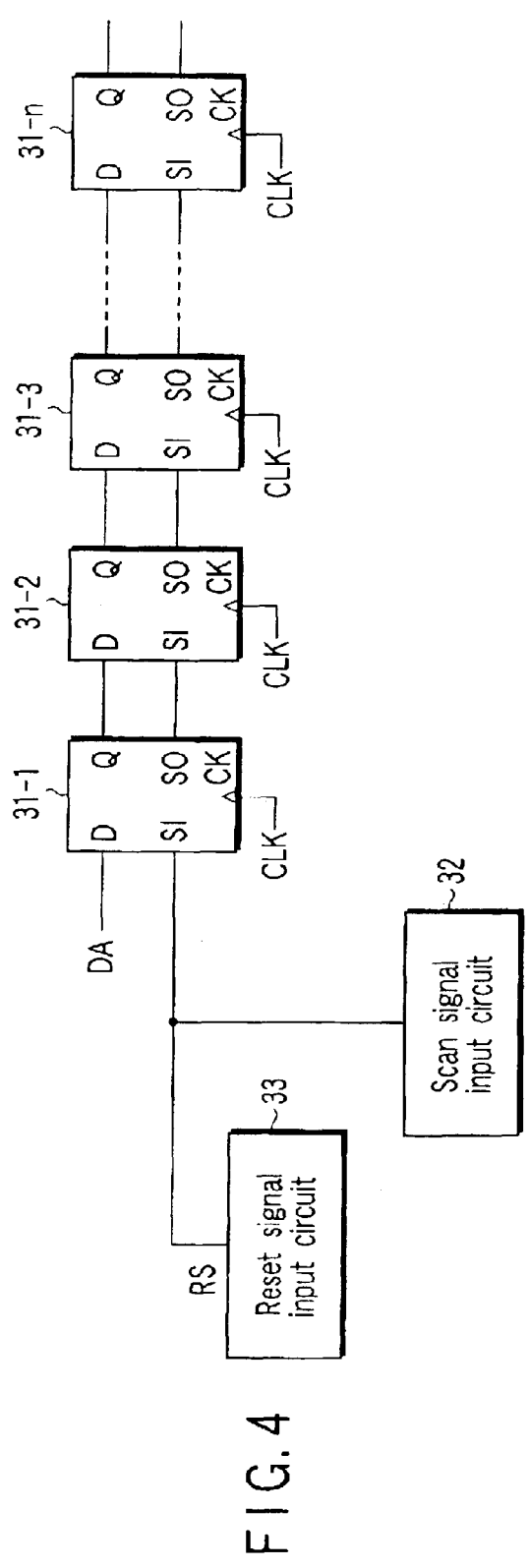
F I G. 4
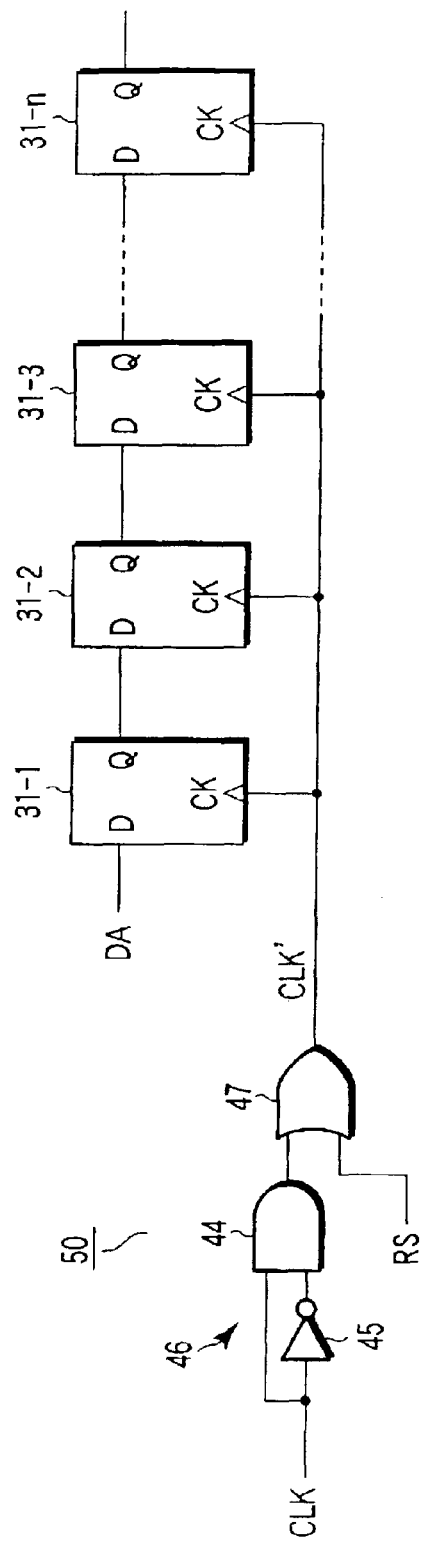
F I G. 6

SEMICONDUCTOR INTEGRATED CIRCUIT DEVICE HAVING FLIP-FLOPS THAT CAN BE RESET EASILY

CROSS-REFERENCE TO RELATED APPLICATIONS

This application is based upon and claims the benefit of priority from the prior Japanese Patent Application No. 2003-014389, filed Jan. 23, 2003, the entire contents of which are incorporated herein by reference.

BACKGROUND OF THE INVENTION

1. Field of the Invention

This invention relates to a semiconductor integrated circuit device having a plurality of flip-flops cascade-connected by having data output terminals respectively connected to data input terminals of the next-stage flip-flops and more particularly to a technique for resetting a plurality of flip-flops.

2. Description of the Related Art

Conventionally, in a semiconductor integrated circuit device having a plurality of flip-flops cascade-connected by having data output terminals respectively connected to data input terminals of the next-stage flip-flops, for example, the semiconductor integrated circuit device is configured as shown in FIG. 1 in order to simultaneously reset the flip-flops. A plurality of flip-flops 11-1, 11-2, ..., 11-n are cascade-connected, that is, data output terminals Q thereof are sequentially and respectively connected to data input terminals D of the next-stage flip-flops. OR gates 12-1, 12-2, ... are inserted in the signal transmission path of the flip-flops 11-1, 11-2, ..., 11-n so that a reset signal RS can be input via the plurality of OR gates at the same time. That is, in the case of FIG. 1, circuits (OR gates 12-1, 12-2) which derive the logical OR of an original transfer signal (data) DA and a reset signal RS are respectively provided in the preceding stages of the first-stage flip-flop 11-1 and (n−1) th-stage flip-flop 11-(n−1). Then, when it becomes necessary to reset the flip-flops 11-1, 11-2, ..., 11-n when the semiconductor integrated circuit device is powered ON, for example, a reset signal RS is supplied to the data input terminals D of the first-stage and (n−1)th-stage flip-flops 11-1, 11-(n−1) by inputting the reset signal RS to the OR gates 12-1, 12-2. After this, a normal clock signal CLK is input to the clock input terminals CK of the flip-flops 11-1, 11-2, ..., 11-n to sequentially transfer the reset signal RS from the first-stage flip-flop 11-1 to the succeeding-stage flip-flops 11-2, 11-3, ....

Each of the OR gates 12-1, 12-2, ... is provided for every preset number of flip-flops and all of the flip-flops 11-1, 11-2, ..., 11-n can be reset in a short period of time by simultaneously inputting the reset signal RS via the OR gates 12-1, 12-2, ... to start the reset operation.

However, with the above configuration, the circuits (OR gates 12-1, 12-2, ...) which derive the logical OR of the reset signal RS and the data DA are always present in the original signal transmission path. Therefore, when data DA is transferred, gate delay due to the presence of the OR gates 12-1, 12-2, ... will occur. Further, wirings to transfer the reset signals RS are required in addition to the OR gates 12-1, 12-2, .... Therefore, the above configuration is disadvantageous from the viewpoint of the operation speed and pattern occupied area.

FIGS. 2A to 2E show examples of the conventional flip-flops with a reset function, for illustrating another conventional semiconductor integrated circuit device. FIG. 2A is a symbol diagram, FIG. 2B is a circuit diagram showing a concrete example of the configuration of a synchronous-reset-type flip-flop, FIG. 2C is a circuit diagram showing a concrete example of the configuration of an asynchronous-reset-type flip-flop, FIG. 2D is a circuit diagram showing an example of the configuration of a NOR gate used in each of the circuits shown in FIGS. 2B and 2C, and FIG. 2E is a timing chart showing the operation of each of the flip-flops shown in FIGS. 2B and 2C.

A flip-flop 13 with the reset function shown in FIG. 2A is configured as shown in FIG. 2B or 2C. The synchronous-reset-type flip-flop 13 shown in FIG. 2B includes a NOR gate 14, inverters 15, 16 and clocked inverters 17, 18, 19.

The asynchronous-reset-type flip-flop 13 shown in FIG. 2C includes clocked inverters 20 to 23 and NOR gates 24, 25.

As shown in FIG. 2D, each of the two-input NOR gates 14, 24 and 25 includes p-channel MOS transistors Tr1 to Tr3 and n-channel MOS transistors Tr4 to Tr6. In the NOR gate, a NOR signal indicating the logical NOR of two input signals A and B is output from a connection node O of the MOS transistors Tr3 and Tr4.

In the synchronous-reset-type flip-flop shown in FIG. 2B, the output terminal Q is set to a low level in synchronism with a rise edge (time t2) of the clock signal input to the clock input terminal CK when a reset signal input to the reset input terminal R is set to a high level. On the other hand, in the asynchronous-reset-type flip-flop shown in FIG. 2C, when a reset signal input to the reset input terminal R is set to a high level, the output terminal Q is set to a low level irrespective of the clock signal at this time point (time t1).

Like the circuit shown in FIG. 1, all of the flip-flops can be reset by using the above flip-flop with the reset function instead of each set of the OR gate 12-1, flop-flop 11-1 and the OR gate 12-2, flop-flop 11-(n−1) in the circuit shown in FIG. 1 or by providing the above flip-flop for every preset number of stages of a plurality of flip-flops which are cascade-connected to transfer a reset signal.

By using the flip-flops with the configurations shown in FIGS. 2A to 2D, gate delay becomes shorter in comparison with that occurring in the circuit in which the OR gates are additionally provided as shown in FIG. 1. However, at the starting time of the reset operation, since the logical levels of the input terminal and output terminal of each logical gate are indefinite, the probability that potentials of the input terminal and output terminal of each logical gate will transit becomes high and the power consumption becomes large.

As the prior art related to this invention, a shift register with a reset function in which the reset control operation can be easily performed without changing the number of constituents of a flip-flop is proposed in Jpn. Pat. Appln. KOKAI Publication No. 2000-187993. In the above prior art, four-series basic control signals are input to each flip-flop to simultaneously transmit an input signal to the last end of the flip-flops by switching the initialization control signal.

BRIEF SUMMARY OF THE INVENTION

A semiconductor integrated circuit device according to an aspect of the present invention comprises a plurality of flip-flops cascade-connected by having data output terminals respectively connected to data input terminals of the next-stage flip-flops and each having a data input terminal for scan test and a data output terminal for scan test, each of the plurality of flip-flops including a first clocked inverter having an input terminal connected to the data input terminal and operated in response to a first clock signal, a second clocked inverter having an input terminal connected to the data input terminal for scan test and an output terminal connected to an output terminal of the first clocked inverter and operated in response to a second clock signal, a latch circuit connected to the output terminals of the first and second clocked inverters, a first inverter having an input terminal connected to the output terminals of the first and second clocked inverters and an output terminal connected to the data output terminal, and a second inverter having an input terminal connected to the output terminals of the first and second clocked inverters and an output terminal connected to the data output terminal for scan test, wherein a reset signal is input via the data input terminal for scan test of the first stage flip-flop among the plurality of flip-flops and sequentially transferred from the data output terminal for scan test to the succeeding-stage flip-flops, via a transmission path different from a data transmission path.

BRIEF DESCRIPTION OF THE SEVERAL VIEWS OF THE DRAWING

FIG. 1 is a circuit diagram showing an example of the configuration of a conventional semiconductor integrated circuit device having a plurality of flip-flops cascade-connected by having data output terminals respectively connected to data input terminals of the next-stage flip-flops in the case where the plurality of flip-flops are simultaneously reset, FIG. 3 is a block diagram showing a plurality of flip-flops cascade-connected by having data output terminals respectively connected to data input terminals of the next-stage flip-flops, for illustrating a semiconductor integrated circuit device according to a first embodiment of this invention, FIG. 4 is a block diagram for illustrating a modification of the circuit shown in FIG. 3, FIG. 6 is a block diagram showing a plurality of flip-flops cascade-connected by having data output terminals respectively connected to data input terminals of the next-stage flip-flops, for illustrating a semiconductor integrated circuit device according to a third embodiment of this invention.

DETAILED DESCRIPTION OF THE INVENTION

First Embodiment

Figure 2A:
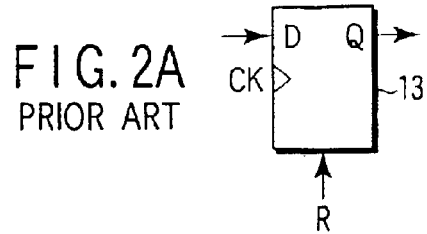
FIG. 2A is a symbol diagram showing the conventional flip-flop with a reset function, for illustrating another conventional semiconductor integrated circuit device.
Figure 2B:
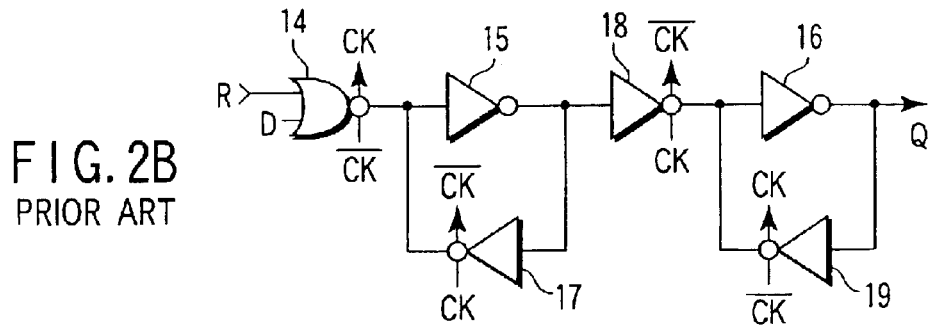
FIG. 2B is a circuit diagram showing a concrete example of the configuration of a synchronous-reset-type flip-flop and showing another example of the conventional flip-flop with a reset function, for illustrating another conventional semiconductor integrated circuit device.
Figure 2C:
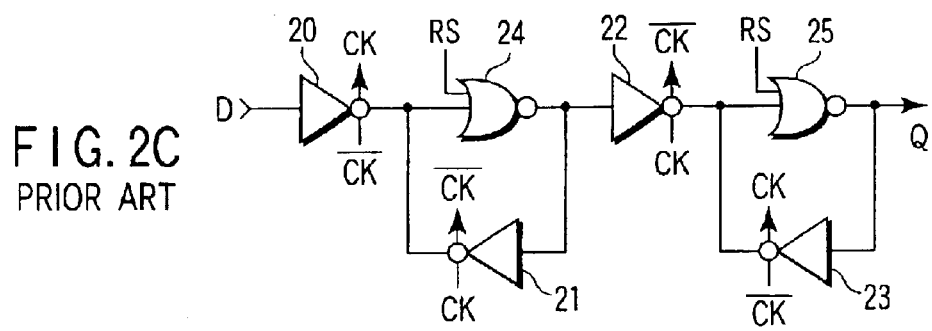
FIG. 2C is a circuit diagram showing a concrete example of the configuration of an asynchronous-reset-type flip-flop and showing another example of the conventional flip-flop with a reset function, for illustrating another conventional semiconductor integrated circuit device.
Figure 2D:
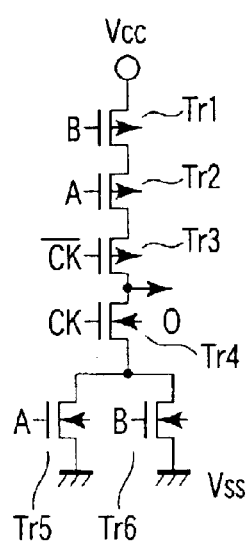
FIG. 2D is a circuit diagram showing an example of the configuration of a NOR gate used in each of the circuits shown in FIGS. 2B and 2C and showing another example of the conventional flip-flop with a reset function, for illustrating another conventional semiconductor integrated circuit device.
Figure 2E:
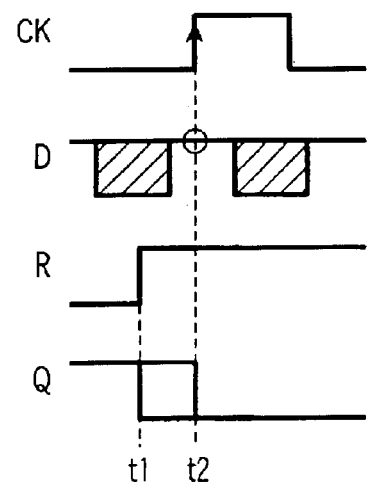
FIG. 2E is a timing chart showing the operation of each of the flip-flops shown in FIGS. 2B and 2C and showing another example of the conventional flip-flop with a reset function, for illustrating another conventional semiconductor integrated circuit device.

FIG. 3 shows a plurality of flip-flops which are cascade-connected by having data output terminals respectively connected to data input terminals of the next-stage flip-flops, for illustrating a semiconductor integrated circuit device according to a first embodiment of this invention. Each of flip-flops 31-1, 31-2, . . . , 31-n has a scan test function and includes a data input terminal D, data output terminal Q, scan test data input terminal SI, scan test data output terminal SO and clock input terminal CK.

Data DA which is an original transfer signal is input to the data input terminal D of the first-stage flip-flop 31-1 and a signal output from the data output terminal Q thereof is supplied to the data input terminal D of the next-stage flip-flop 31-2. Likewise, signals output from the respective data output terminals Q of the mth-stage flip-flops 31-m (m=2, 3, . . . , n−1) are sequentially supplied to the data input terminals D of the next-stage ((m+1)th-stage) flip-flops 31-(m+1).

Further, a reset signal RS is input from a scan signal input circuit 32 to the scan test data input terminal SI of the first-stage flip-flop 31-1. The scan signal input circuit 32 is controlled by a control signal CS and configured to selectively output one of scan test data and reset signal RS. In other words, it outputs "0" as scan test data when the flip-flop is reset to a "0" state. A signal output from the scan test data output terminal SO is supplied to the scan test data input terminal SI of the next-stage flip-flop 31-2. Likewise, signals output from the respective scan test data output terminals SO of the mth-stage flip-flops 31-m (m=2, 3, . . . ,n−1) are sequentially supplied to the scan test data input terminals SI of the next-stage ((m+1)th-stage) flip-flops 31-(m+1).

Further, a clock signal CLK is supplied to the clock input terminals CK of the flip-flops 31-1, 31-2, . . . , 31-n and data DA, scan test data and reset signal RS are sequentially transferred through the flip-flops 31-1, 31-2, . . . , 31-n in synchronism with the clock signal CLK.

With the above configuration, since the reset signal RS is transferred via a transmission path for scan test which is provided separately from the transmission path for the original transfer signal (data) DA, signal delay (gate delay caused by the OR gate) at the time of normal operation for transferring the data DA can be substantially completely eliminated and the operation speed can be enhanced. Further, since it is not necessary to provide the OR gate and wirings used to transfer the reset signal, the pattern occupied area can be reduced.

In the first embodiment, a case wherein the reset signal RS is supplied from the scan signal input circuit 32 is explained as an example. However, as shown in FIG. 4, it is also possible to provide a dedicated circuit (reset signal input circuit 33) which inputs a reset signal RS in addition to the scan signal input circuit 32.

Since the number of wirings and circuits can be reduced in comparison with a case wherein the reset signal input circuit 33 is provided if the reset signal RS is supplied by use of the scan signal input circuit 32, the pattern occupied area can be reduced. However, if the scan signal input circuit 32 is used, it is necessary to previously set the scan signal control circuit so as to cause the circuit which transfers the reset signal RS to be correctly operated before each of the flip-flops 31-1, 31-2, . . . , 31-n is reset. As a result, the reset operation becomes complicated. Therefore, whether the scan signal input circuit 32 is also used as the reset signal input circuit or the reset signal generation circuit 33 is additionally provided may be selectively determined as required.

Further, in the present embodiment, a case wherein the reset signal is input via the scan test input terminal is explained by taking the flip-flop with the scan test function as an example. However, another type of flip-flop can be used to attain the same purpose if it has an external input/output terminal other than the data input/output terminal.

In the above explanation, a case wherein all of the flip-flops 31-1, 31-2, . . . , 31-n have the scan test data input terminals SI and data output terminals SO is explained as an example, but it is of course possible that only some of the n flip-flops may have the above input and output terminals.

Second Embodiment

Figure 5A:
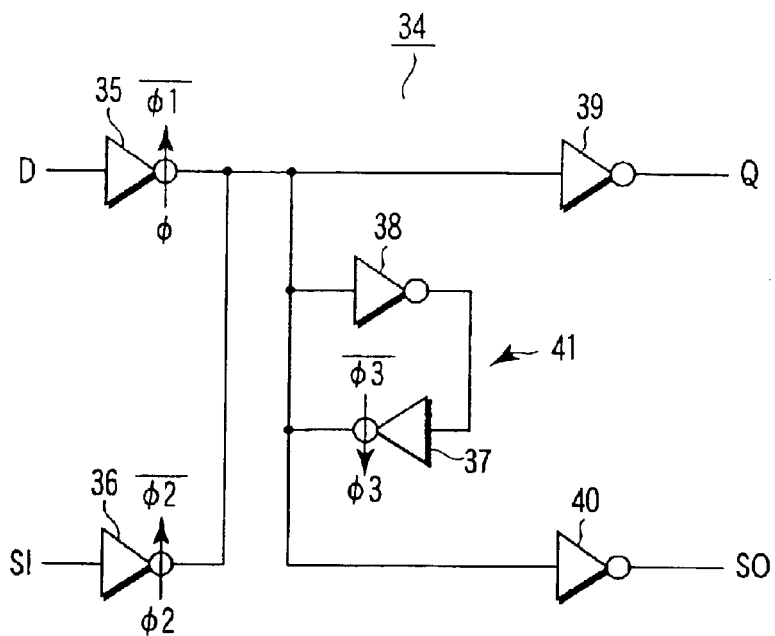
FIG. 5A is a circuit diagram showing a concrete example of the configuration of a pulse-driven-type flip-flop with a scan test function, for illustrating a semiconductor integrated circuit device according to a second embodiment of this invention.
Figure 5B:
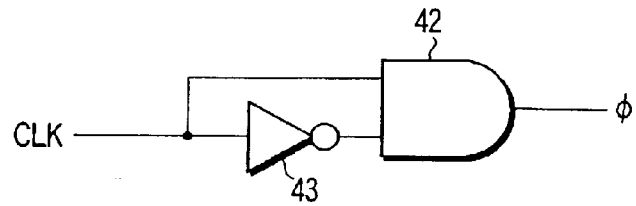
FIG. 5B is a circuit diagram showing a waveform shaping circuit which generates a clock signal used in the circuit of FIG. 5A, for illustrating the semiconductor integrated circuit device according to the second embodiment of this invention.
Figure 5C:
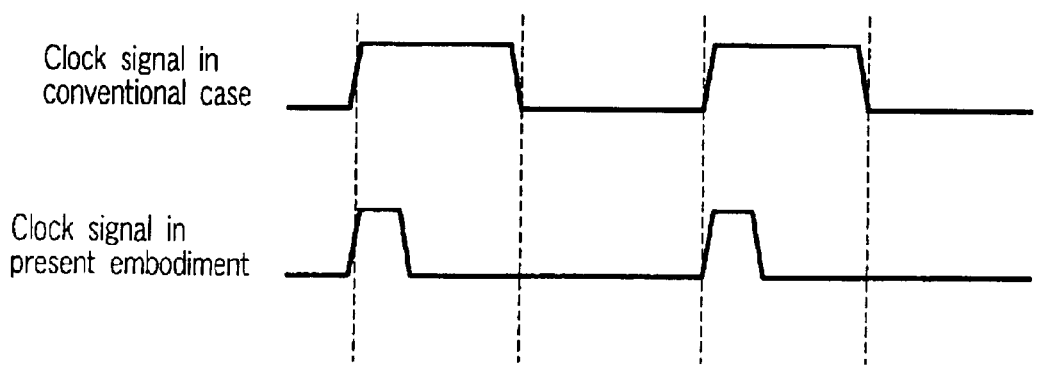
FIG. 5C is a timing chart showing the clock signal used in the present embodiment in comparison with the clock signal used in the conventional case, for illustrating the semiconductor integrated circuit device according to the second embodiment of this invention.

FIGS. 5A to 5C are circuit diagrams and timing chart for illustrating a semiconductor integrated circuit device according to a second embodiment of this invention. FIG. 5A shows a concrete example of the configuration of a pulse-driven-type flip-flop with a scan test function. FIG. 5B shows a waveform shaping circuit to generate a clock signal used in the circuit of FIG. 5A. FIG. 5C is a timing chart showing the clock signal used in the present embodiment in comparison with the clock signal used in the conventional case.

In the semiconductor integrated circuit device, flip-flops having the same configuration as the flip-flop shown in FIGS. 5A and 5B are cascade-connected as shown in FIG. 3. That is, data output terminals Q and scan test data output terminals SO of the flip-flops are sequentially and respectively connected to data input terminals D and scan test data input terminals SI of the next-stage flip-flops. Each flip-flop 34 includes clocked inverters 35, 36, 37 and inverters 38, 39, 40. The clocked inverter 35 has an input terminal connected to the data input terminal D and is operated in response to clock signals /φ1, φ1. The clocked inverter 36 has an input terminal connected to the scan data input terminal SI for scan test and an output terminal connected to the output terminal of the clocked inverter 35 and is operated in response to clock signals /φ2, φ2. A latch circuit 41 configured by the inverter 38 and clocked inverter 37 is connected to the output terminals of the clocked inverters 35, 36. The input terminal of the inverter 38 is connected to the output terminals of the clocked inverters 35, 36. The clocked inverter 37 is operated in response to clock signals φ3, /φ3 and the input and output terminals thereof are respectively connected to the output and input terminals of the inverter 38. The clock signals φ3, /φ3 are equal to the logical OR signals of the clock signals φ1, /φ1 and the clock signals φ2, /φ2. The input terminal of the inverter 39 is connected to the output terminals of the clocked inverters 35, 36 and the output terminal thereof is connected to the data output terminal Q. Further, the input terminal of the inverter 40 is connected to the output terminals of the clocked inverters 35, 36 and the output terminal thereof is connected to the scan data output terminal SO.

The clock signals φ1 to φ3, /φ1 to /φ3 are generated by a waveform shaping circuit as shown in FIG. 5B. The waveform shaping circuit is configured by an AND gate 42 and an inverter 43 functioning as a delay circuit. The clock signal CLK input to the waveform shaping circuit is waveform-shaped into a clock signal φ which is kept set at a high level for a period corresponding to the delay time caused by the inverter 43.

In the pulse-driven-type flip-flop of the present embodiment, the control operation is performed by use of the clock signals φ1 to φ3, /φ1 to /φ3 in which the high-level and low-level periods are made different. As shown in FIG. 5C, the duty cycle of the conventional clock signal is set to "1". That is, the high-level and low-level periods are substantially set equal to each other. On the other hand, in the present embodiment, the high-level period is made shorter than the low-level period by use of the waveform shaping circuit shown in FIG. 5B.

Next, the operation of the circuit with the above configuration is explained. In this case, a signal is transferred when the clock signals φ1 to φ3 are set at the high level and the signal previously transferred is held when the clock signals are set at the low level. Like the case of the first embodiment, in the flip-flop, a scan test transmission path is provided in addition to the original transfer signal (data) DA transmission path. At the time of scan test, a test signal is input via the scan test input terminal SI and the clock signals φ1 to φ3, /φ1 to /φ3 are input to transfer the test signal in the flip-flop and output the test signal from the scan test output terminal SO. Then, the test signal is supplied to the scan test input terminal SI of the next-stage flip-flop.

At the reset time, a reset signal RS is input via the scan test input terminal SI ("0" is input as scan test data when the flip-flop is reset to a "0" state) and the reset signal is sequentially transferred to succeeding-stage flip-flops via a path different from the original signal transmission path in synchronism with the clock signals φ1 to φ3, /φ1 to /φ3.

With the above configuration, since the reset signal RS is transferred via the scan test transmission path provided separately from the original transfer signal (data) DA transmission path, signal delay (gate delay caused by the OR gate) at the normal operation time can be substantially completely eliminated. As a result, the operation speed can be enhanced. Further, since it is not necessary to provide the OR gate and wirings used to transfer the reset signal, the pattern occupied area can be reduced. Also, since the pulse-driving operation is performed by use of the clock signals φ1 to φ3, /φ1 to /φ3 in which the high-level period is short, the power consumption is reduced.

Third Embodiment

FIG. 6 shows a plurality of flip-flops which are cascade-connected by having data output terminals respectively connected to data input terminals of the next-stage flip-flops, for illustrating a semiconductor integrated circuit device according to a third embodiment of this invention.

Each of flip-flops 31-1, 31-2, ..., 31-n is of pulse-driven-type and has a data input terminal D, data output terminal Q and clock input terminal CK.

Data DA which is an original transfer signal is input to the data input terminal D of the first-stage flip-flop 31-1 and a signal output from the data output terminal Q thereof is supplied to the data input terminal D of the next-stage flip-flop 31-2. Likewise, signals output from the respective data output terminals Q of the mth-stage flip-flops 31-m (m=2, 3, ..., n–1) are sequentially supplied to the data input terminals D of the next-stage ((m+1)th-stage) flip-flops 31-(m+1).

Further, a clock signal CLK' output from a clock signal level fixing circuit 50 is supplied to the clock input terminals CK of the flip-flops 31-1, 31-2, ..., 31-n. The clock signal level fixing circuit 50 includes a waveform shaping circuit configured by an AND gate 44 and inverter 45 and an OR gate 47. The clock signal level fixing circuit 50 derives the logical OR of the reset signal RS and a pulse-like clock signal output from the waveform shaping circuit 46 in order to fix the clock signal CLK' at the high level at the reset time and supplies the clock signal to the clock input terminals CK of the flip-flops 31-1, 31-2, ..., 31-n. The OR gate 47 will not have any influence on the signal transmission at the normal operation time since it has no relation with the data DA transmission path at the normal operation time.

In the pulse-driven-type flip-flop, input data DA can be transmitted to the succeeding stage as it is by fixing the clock signal at the high level. Signal transmission delay time caused in a path from a flip-flop to the next-stage flip-flop is shorter than one clock cycle. Therefore, the reset signal can be transferred at higher speed than in a case where a clock signal is input as in the normal case to sequentially transfer the reset signal to the succeeding-stage flip-flops. That is, the reset operation can be performed at high speed within one clock cycle.

In the third embodiment, the clock signal level fixing circuit 50 is commonly provided for all of the flip-flops, but it is possible to provide the clock signal level fixing circuit 50 for each flip-flop or for every preset number of flip-flops as required.

Further, a case of the flip-flop having no scan function is explained as an example, but like the first and second embodiments, it is of course possible to similarly apply the present embodiment to the flip-flop with the scan function.

Fourth Embodiment

Figures 7, 8:
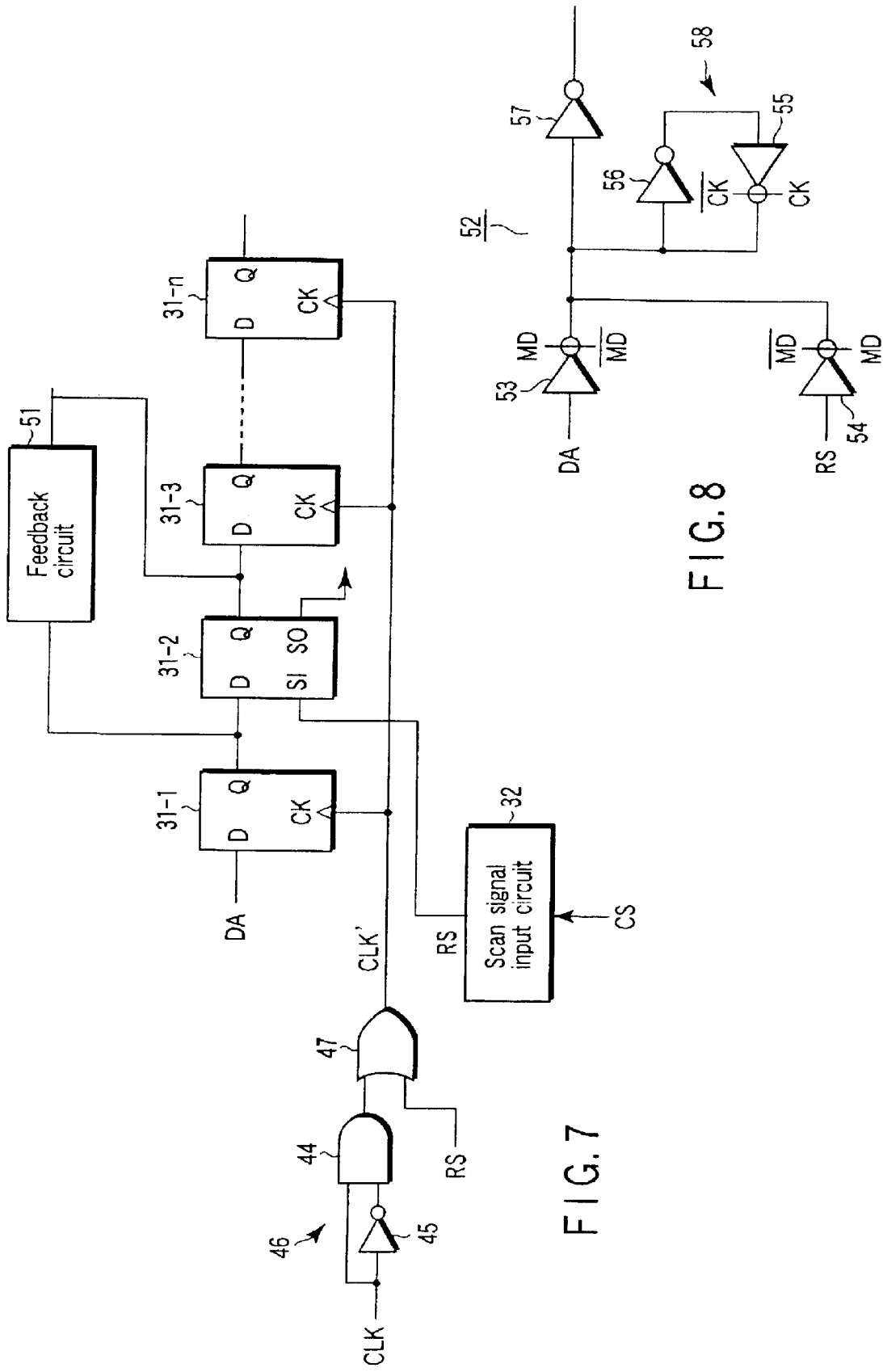
FIG. 7 is a block diagram showing a plurality of flip-flops cascade-connected by having data output terminals respectively connected to data input terminals of the next-stage flip-flops, for illustrating a semiconductor integrated circuit device according to a fourth embodiment of this invention.
FIG. 8 is a circuit diagram showing a concrete example of the configuration of the first-stage flip-flop of pulse-driven-type, for illustrating a semiconductor integrated circuit device according to a fifth embodiment of this invention.

FIG. 7 shows a plurality of flip-flops which are cascade-connected by having data output terminals respectively connected to data input terminals of the next-stage flip-flops, for illustrating a semiconductor integrated circuit device according to a fourth embodiment of this invention. In this example, a feedback circuit 51 is connected between a data input terminal D and data output terminal Q of a flip-flop 31-2 to feed back a signal output from the data output terminal Q of the flip-flop 31-2 to the data input terminal D via the feedback circuit 51.

With the above configuration, if the third embodiment is applied to this configuration and the flip-flops are forcibly set into an open state (a state in which the clock signal CLK' is fixed at the high level and the data input terminal D and data output terminal Q of each flip-flop are electrically connected to each other), there is a possibility that oscillation will occur.

Therefore, in such a case, it is necessary to set at least one of flip-flops 31-1, 31-2, , 31-n into a closed state (a state in which the data input terminal D and data output terminal Q of the flip-flop are not electrically connected to each other). In the example of FIG. 7, the flip-flop 31-2 connected to the feedback circuit 51 is configured by a flip-flop with a scan test function which can be supplied with a reset signal RS from a scan signal input circuit 32.

With the above configuration, a reset signal can be rapidly transferred while occurrence of oscillation is being prevented.

In a case where it is desired to reset a specified one of the cascade-connected flip-flops to a preset value ("1" reset) instead of simply reset each of the flip-flops to the "0" state, the specified flip-flop can be reset to the preset value while the preceding-stage and succeeding-stage flip-flops of the specified flip-flop are kept set in the closed state. That is, flip-flops with the scan test function are used as the specified flip-flop which is desired to be reset to the preset value and the preceding-stage and succeeding-stage flip-flops of the specified flip-flop and signals (for example, "0", "1", "0") corresponding to a reset pattern from the scan signal input circuit 32 may be input to the flip-flops to reset the same.

In a case other than the case wherein the feedback circuit is provided or the specified flip-flop is reset to the preset value, the technique for inputting the reset signal RS from the scan signal input circuit 32 as explained in the first and second embodiments and the technique for fixing the clock signal at the high level as explained in the third embodiment can be used in combination. In this case, the flip-flop to which the reset signal RS is directly input can be forcibly set into the open state or may not be necessarily forcibly set into the open state. If the flip-flop is forcibly set into the open state, it is possible to set the position of the gate which is opened or closed by the reset signal not after but before the gate which is operated by the original clock signal.

Fifth Embodiment

FIG. 8 is a circuit diagram showing a concrete example of the configuration of the first-stage flip-flop of pulse-driven-type, for illustrating a semiconductor integrated circuit device according to a fifth embodiment of this invention. The first-stage flip-flop 52 includes clocked inverters 53, 54, 55 and inverters 56, 57. Data DA is input to the input terminal of the clocked inverter 53. Signals MD, /MD indicating the operation mode are supplied to the clock input terminals of the clocked inverter 53 so as to cause the input data DA to be inverted and output in the normal operation mode and set the output terminal of the clocked inverter 53 to the high-impedance state in a reset mode.

A reset signal RS is input to the input terminal of the clocked inverter 54. The signals MD, /MD indicating the operation mode are supplied to the clock input terminals of the clocked inverter 54 so as to set the output terminal of the clocked inverter 54 to the high-impedance state in the normal operation mode and cause the input reset signal RS to be inverted and output in a reset mode.

A latch circuit 58 configured by the inverter 56 and clocked inverter 55 is connected to the output terminals of the clocked inverters 53, 54. Further, an input terminal of the inverter 57 is connected to the output terminals of the clocked inverters 53, 54.

In the semiconductor integrated circuit device, the first-stage flip-flop with the configuration shown in FIG. 8 and the second-stage and succeeding-stage flip-flops with the configuration obtained by removing the clocked inverter 54 are cascade-connected by having the data output terminals Q of the flip-flops respectively connected to the data input terminals D of the next-stage flip-flops as shown in FIG. 3.

In the present embodiment, since the reset signal RS can be transferred via a transmission path which is different from a transmission path for an original transfer signal (data) DA by inputting the reset signal RS via the clocked inverter 54, no influence is had on signal transmission in the normal operation mode. Therefore, signal delay (gate delay caused by the OR gate) can be substantially completely eliminated and the operation speed can be enhanced. Further, since the effect can be attained only by additionally providing the clocked inverter, an increase in the pattern occupied area can be suppressed to minimum.

In the fifth embodiment, the reset signal inputting clocked inverter is provided only in the first-stage flip-flop to input the reset signal. However, it is also possible to provide the clocked inverter for each flip-flop or for every preset number of flip-flops as required. The reset time can be shortened by providing a large number of reset signal inputting clocked inverters.

Furthermore, it can be applied to a semiconductor integrated circuit device having the flip-flops that a reset signal can be input from the outside and that makes transmit a reset signal sequentially.

In each of the above embodiments, cases wherein the flip-flops with the scan test function and pulse-driven-type flip-flops are used as examples are explained, but flip-flops with different configurations such as master-slave flip-flops can also be used.

As described above, according to one aspect of this invention, a semiconductor integrated circuit device in which the operation speed can be enhanced and the pattern occupied area can be reduced can be attained.

Further, a semiconductor integrated circuit device in which an increase in power consumption can be suppressed even when the reset operation speed is enhanced can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a plurality of flip-flops cascade-connected by having data output terminals respectively connected to data input terminals of the next-stage flip-flops and each having a data input terminal for scan test and a data output terminal for scan test, each of the plurality of flip-flops including a first clocked inverter having an input terminal connected to the data input terminal and operated in response to a first clock signal, a second clocked inverter having an input terminal connected to the data input terminal for scan test and an output terminal connected to an output terminal of the first clocked inverter and operated in response to a second clock signal, a latch circuit connected to the output terminals of the first and second clocked inverters, a first inverter having an input terminal connected to the output terminals of the first and second clocked inverters and an output terminal connected to the data output terminal, and a second inverter having an input terminal connected to the output terminals of the first and second clocked inverters and an output terminal connected to the data output terminal for scan test,
wherein a reset signal is input via the data input terminal for scan test of the first stage flip-flop among the plurality of flip-flops and sequentially transferred from the data output terminal for scan test to the succeeding-stage flip-flops via a transmission path different from a data transmission path.

2. The semiconductor integrated circuit device according to claim 1, wherein the latch circuit includes a third inverter having an input terminal connected to the output terminals of the first and second clocked inverters, and a third clocked inverter having an input terminal connected to an output terminal of the third inverter and an output terminal connected to the output terminals of the first and second clocked inverters and operated in response to a third clock signal.

3. The semiconductor integrated circuit device according to claim 2, wherein the third clock signal is a logical OR signal of the first and second clock signals.

4. The semiconductor integrated circuit device according to claim 1, wherein the plurality of flip-flops are of a pulse-driven-type and sequentially transfer the reset signal input via the data input terminal for scan test of the first-stage flip-flop in synchronism with a clock signal.

5. The semiconductor integrated circuit device according to claim 1, wherein the plurality of flip-flops each have a scan test function.

6. The semiconductor integrated circuit device according to claim 1, further comprising a scan signal input circuit which inputs a test scan signal to the data input terminal for scan test of the first-stage flip-flop, the reset signal being supplied from the scan signal input circuit.

7. The semiconductor integrated circuit device according to claim 1, further comprising a reset signal input circuit which inputs the reset signal to the data input terminal for scan test of the first-stage flip-flop.

8. The semiconductor integrated circuit device according to claim 1, further comprising a waveform shaping circuit which sets a high-level period of the first to third clock signals shorter than a low-level period thereof.

* * * * *